United States Patent [19]

Schmitt et al.

[11] Patent Number: 4,460,868
[45] Date of Patent: Jul. 17, 1984

[54] FIXTURE FOR TESTING SEMICONDUCTOR DEVICES

[75] Inventors: Edward T. Schmitt, Indianapolis, Ind.; Harold R. Ronan, Jr.; Malcolm R. Schuler, both of Mountaintop, Pa.

[73] Assignee: RCA Corporation, New York, N.Y.

[21] Appl. No.: 322,002

[22] Filed: Nov. 16, 1981

[51] Int. Cl.³ .............................................. G01R 1/06
[52] U.S. Cl. ................................ 324/158 F; 324/72.5; 324/158 P; 339/108 TP
[58] Field of Search ............... 324/158 F, 158 P, 72.5, 324/73 PC; 339/108 TP

[56] References Cited

U.S. PATENT DOCUMENTS

| | | | |
|---|---|---|---|
| 3,458,687 | 7/1969 | Cranch | 324/158 F |
| 3,710,251 | 1/1973 | Hagge et al. | 324/158 F |
| 3,759,082 | 9/1973 | Provenzano et al. | 73/1 |
| 3,939,414 | 2/1976 | Roch | 324/158 |
| 3,949,295 | 4/1976 | Moorshead | 324/158 F |
| 3,996,517 | 12/1976 | Fergason et al. | 324/158 |
| 4,023,102 | 5/1977 | Barrow et al. | 324/158 F |
| 4,047,780 | 9/1977 | Cedrone | 339/17 |
| 4,115,736 | 9/1978 | Tracy | 324/158 F |

OTHER PUBLICATIONS

"Self-Shorting Voltage Probe", *IBM Tech. Disc.*, vol. 22, No. 1, Jun. 1979, by K. J. Deskur et al., pp. 77-78.

*Primary Examiner*—Stewart J. Levy
*Attorney, Agent, or Firm*—Birgit E. Morris; Donald S. Cohen; Thomas H. Magee

[57] ABSTRACT

The preferred embodiment of the invention disclosed herein relates to an apparatus for testing semiconductor devices on a wafer containing a plurality of such devices. The apparatus includes a base having a support surface on which the semiconductor wafers can be located. The base further includes heater means for heating the surface and, thus, any wafers located thereon. Support stand means is associated with the base and extends above the support surface and a test probe unit connected in an electric test circuit is adjustably mounted on the support plate so that the probe unit is normal to and movable relative to the surface. Preferably, the test probe includes a tip that engages the wafer and this tip does not rotate when the position of the probe unit is adjusted.

7 Claims, 2 Drawing Figures

FIXTURE FOR TESTING SEMICONDUCTOR DEVICES

BACKGROUND OF THE INVENTION

This invention relates to test apparatus and, more particularly, to a fixture used for testing semiconductor devices.

During the manufacture of semiconductor devices, it is desirable to find defects as soon as possible in the manufacturing process. Early identification of defects, of course, results in manufacturing economies by allowing the discontinuance of the manufacturing process. In this way, the additional cost incurred by processing defective wafers is minimized.

One particular test used to determine the suitability of certain semiconductor devices, for example, power devices, is to determine the high temperature reverse bias leakage current of a P-N junction. Prior to this invention, such testing was carried out on finished devices, that is packaged devices including leads. The leads were connected into an appropriate test circuit for applying a reverse bias across the junction, the temperature of the device was raised and thereafter, the reverse bias leakage current was measured.

The major problem with the above described test procedure is that it is carried out after manufacture of the device is completed. Thus, needless manufacturing expense has been incurred if the device is found to be defective. It would be desirable, therefore, to provide apparatus for testing semiconductor devices as early in the manufacturing process as possible. This is when the devices are still on the wafer and before they are separated and packaged.

SUMMARY OF THE INVENTION

In accordance with this invention there is provided a test fixture for testing individual semiconductor devices before such devices are separated from the wafer. The fixture comprises a base having a surface on which a semiconductor wafer can be located and heater means for heating that surface as well as any semiconductor wafers thereon. A support stand is associated with the base and includes a support plate spaced from the base surface. A test probe is adjustably mounted on the support plate and extends toward the base surface in a direction normal thereto. The test probe is arranged so that it is movable toward and away from the base surface and, thus, any semiconductor wafer located thereon. Preferably, the test probe includes a tip adapted to engage a wafer and is constructed to allow axial movement of the tip while not allowing it to rotate.

BRIEF DESCRIPTION OF THE DRAWING

For a better understanding of the invention, reference is made to the following description of a preferred embodiment thereof, taken in conjunction with the figures of the accompanying drawing, in which.

DETAILED DESCRIPTION OF A PREFERRED EMBODIMENT

Figure 1:
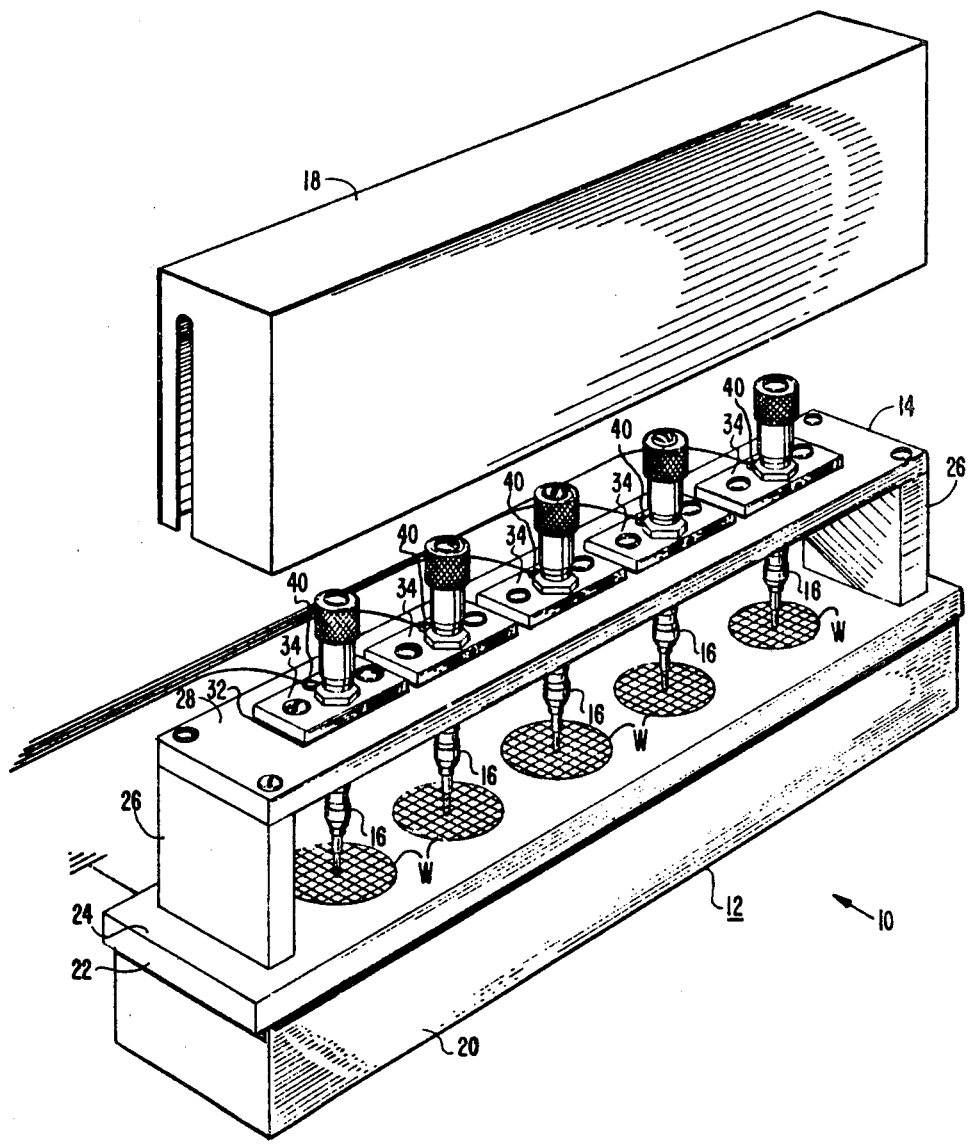
FIG. 1 is a perspective view of a test fixture in accordance with this invention.

In the drawing there is disclosed a test fixture 10 for use in carrying out a high temperature, reverse bias leakage current test on a semiconductor device which is still on a wafer W on which a plurality of such devices have been formed. Thus, the semiconductor devices have not yet been separated from each other or packaged. The test fixture 10 disclosed herein is arranged to test devices on five wafers at a time, but it should be understood that more or less can be so tested with appropriate modifications. The test fixture 10 includes a base 12 and a support stand 14 on which a plurality, five in this case, of test probe units 16 are supported so that they extend toward the base 12 in a direction normal thereto. Each test probe unit 16 is electrically connected in a suitable test circuit and is adjustable in that it can be moved toward and away from wafer W. The base 12 is connected to ground in the test circuit as generally illustrated in FIG. 1 and is operatively associated with heater means, illustrated generally at 20, for heating the wafers W. A cover member 18 is associated with the fixture 10 and is of a size to mate with the outer periphery of the base 12 and enclose the support stand 14 and test probe units 16 when conducting tests.

The base 12 includes the heater means 20 on which is carried a base member 22 having a generally planar support surface 24 on which the wafers W can be placed. The heater means 20, in the apparatus disclosed here, is in the form of a resistance heater, for example, a generally conventional "hot plate" and the base member 22 is an Inconel plate secured to the upper or heating surface of the hot plate by a suitable thermally conductive epoxy resin. The power output of the heater means 20 is such that wafers W placed on the surface 24 can be heated to a temperature of about 150° C., the temperature at which the wafers are to be tested. Of course, the power output of the heater means 20 can be varied depending on the temperature at which the wafers are to be tested. The use of the Inconel base member 22 is preferred inasmuch as the upper surface of conventional hot plates is aluminum or other easily oxidizable material and the presence of an oxide in conducting the tests is highly undesirable.

Figure 2:
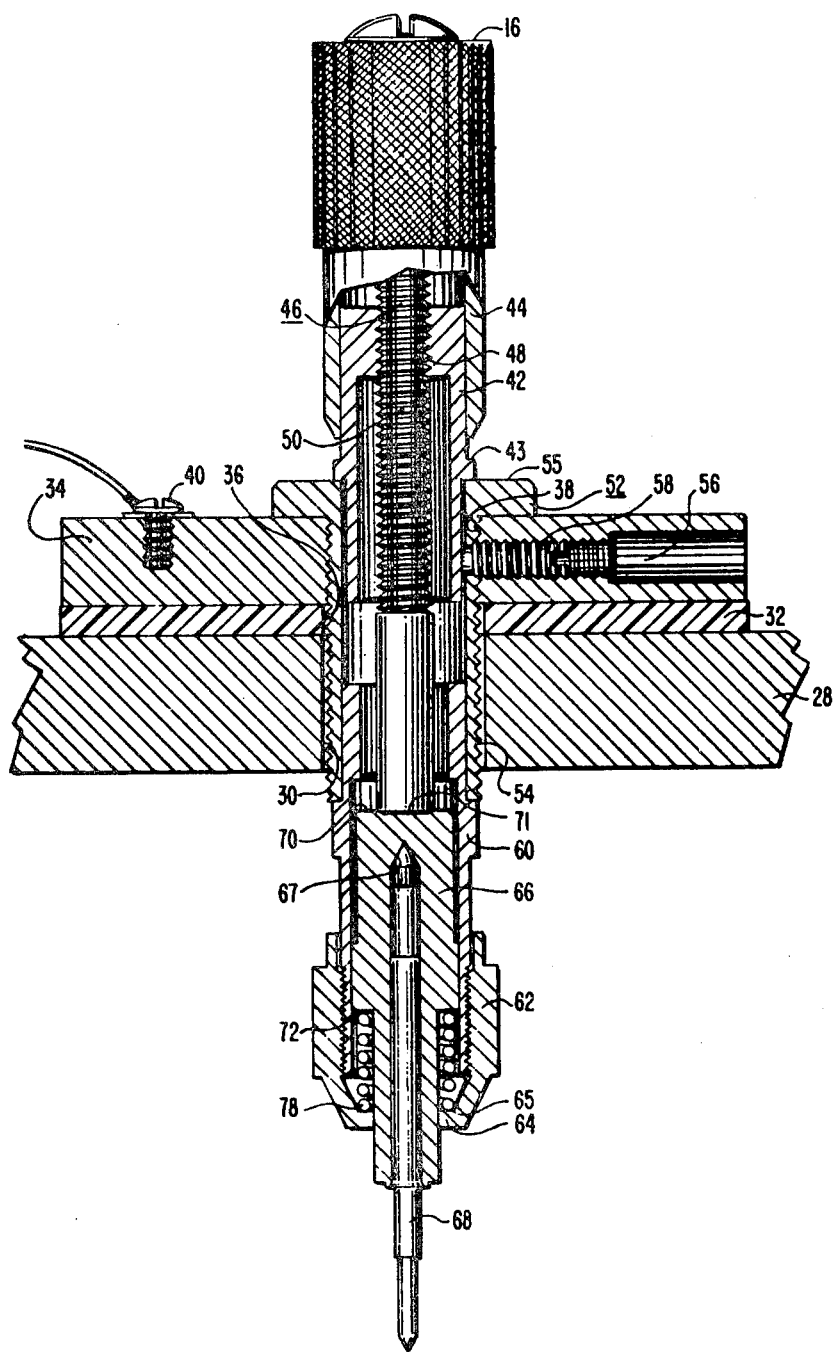
FIG. 2 is a section view taken generally along the line 2—2 of FIG. 1.

The support stand 14 includes heat insulating spacer members 26, 26 each of which has a generally elongated shape, and these members 26 are secured at one end to the support surface 24. The spacer members 26, 26 extend upwardly from the support surface 24 a suitable distance to accommodate the test probe units 16. At their free or upper ends, the spacer members 26, 26 are connected by a support plate 28 that extends generally parallel to the support surface 24. At predetermined locations along its length (the distance between spacers 26, 26) the plate 28 is formed with a plurality of openings 30 each of which is associated with a test probe unit 16 as best seen in FIG. 2. On the upper surface of the plate 28 there is provided a electrically insulating sheet 32 and over this sheet a plurality of electrically conductive, for example, metal, mounting blocks 34 are secured to the plate 28. The sheet 32 and each of the mounting blocks 34 are formed with openings 36 and 38, respectively, which openings are generally aligned with the openings 30 in the plate 28. The openings 38 are threaded to receive a test probe unit 16 as will be made clear hereinafter. Each probe unit 16 is in electrical contact with its associated mounting block 34 so that an electrical connection from the test circuit can be made to the probe unit through an appropriate terminal 40.

One of the probe units 16 will now be described in detail with particular reference to FIG. 2, but it should be understood that the other four test units disclosed in FIGS. 1 and 2 are generally the same. A test unit 16 includes the sleeve 42, thimble 44 and spindle 46 of a conventional micrometer. Thus, the sleeve 42 is a generally cylindrical member formed with an internally threaded portion 48 adjacent one end and thimble 44 is a generally cylindrical member having an inner diameter of a size to fit over the outer periphery of the sleeve 42 in sliding engagement therewith. As is usual, the spindle 46 is coaxially mounted within the thimble 44 for rotation therewith and includes an externally threaded portion 50 that engages with the internally threaded portion 48 of the sleeve 42. Rotation of the thimble 44 and thus the spindle 46 axially displaces both the spindle and the thimble relative to the sleeve 42.

The micrometer unit just described fits loosely in a generally cylindrical adapter 52 formed with external threads 54 that engage with the threaded opening 38 in its associated mounting block 34. The adapter 52 is also formed with a flange 55 that bears on the top surface of the mounting block 34 and locates the adapter in the block 34 with the sleeve extending through the openings 30 and 36 in the support plate 28 and insulating sheet 32, respectively. The sleeve 42 of the micrometer unit is formed with a flange 43 that bears on the top surface of the flange 55 and locates the micrometer unit such that the spindle 46 and a portion of the sleeve 42 are located in the adapter 52. The mounting block 34 is formed with an opening 56 extending radially from the threaded opening 38 to an outer edge of the block 34 so that a set screw 58 can be used to secure the sleeve 42 against rotation in the adapter 52.

A second sleeve member 60 of generally cylindrical shape is formed at one end with a diameter such that it can be pressed into and retained in the adapter 52. At its other end, the sleeve member 60 is formed with an external thread that cooperates with an internal thread formed on the cylindrical portion of a generally cup-shaped cap member 62. Thus, cap member 62 includes a generally planar portion 64 formed with an opening, and the inside of the planar portion provides an internal bearing surface 65. Inside the sleeve member 60 there is a holder 66 including a reduced diameter end portion extending through the opening in the planar portion 64 of the cap member 62. A bore 67 is formed in the holder 66 from the end of the reduced diameter portion, and a needle like tip 68 is carried in the bore by a press fit and extends beyond the end of the reduced diameter portion. The other end of the holder 66 is provided with a flat bearing surface 70 that abuts the flat end surface 71 of the spindle 46. Extending between the bearing surface 65 and a bearing surface 72 formed between the enlarged and reduced diameter portions of the holder 66, is a spring 78 that biases the bearing surface 70 of the holder against the end surface 71 of the spindle 46.

As noted previously, the connection from the electrical test circuit is made through the terminal 40, and the mounting block 34 and test probe unit 16 are made of a conductive metal so that the tip 68 is connected into the circuit and completes that circuit through the wafer W and the electrically grounded base member 22.

In use, wafers W are placed in position under the test probe units 16. The test probe units are manually adjusted so that each tip 68 engages a particular semiconductor device on the wafer W, and clamps it in place on the base member 22. The cover 18 is then placed over the test unit and the heater means 20 and test circuits are energized whereupon a high temperature reverse leakage current test can be carried out in a conventional manner.

A particular advantage of the invention is the fact that the tip 68 clamps the wafer W in place. This avoids the use of an expensive vacuum hold down system usual in test devices of this type. In addition, since the probe 16 is normal to the base member 22 and thus the wafer W, the clamping force includes no component extending laterally along the surface of the wafer. If the probe 16 extends at an angle to the wafer W, the lateral component of force acting in concert with the thermal expansion of the wafer as it is heated could cause the wafer to slide sideways such that contact could be lost between the probe and the required contact point on the wafer. Such loss of contact would invalidate the test.

Rotation of the thimble 44 and spindle 46 when adjusting the position of the tip 68 relative to a wafer W is not translated to the tip. As the spindle 46 rotates, its end surface 71 rotates on the bearing surface 70 of the holder 66 without causing it to rotate. Consequently, the tip 68 does not rotate. The axial movement of the spindle 46 in the downward direction, that is, toward the wafer W, forces the holder 66 and tip 68 to move in the same direction against the force of the spring 78. When the tip 68 engages and clamps the wafer W, rotation of the thimble is discontinued. When the test is completed, the thimble 44 is rotated so that the spindle 46 moves upwardly, that is, away from the wafers W. The biasing force of the spring 78 causes the holder 66 to follow the spindle 46 and, thus, the tip 68 also moves upwardly away from the wafer W. When the tip 68 is a sufficient distance away from the wafer W, rotation of the thimble 44 is discontinued and the wafer W is removed from the base member 22. Those wafers that have successfully passed the test are further processed and those that failed are discarded.

If the tip 68 rotated with the spindle 46, the tip could experience eccentric rotary motion about the longitudinal axis of the probe 16. Such motion results from the normal manufacturing tolerances involved in making the probe. Such an eccentric motion would present severe problems in aligning the tip 68 with the minute required contact point on the wafer. Thus, the arrangement disclosed here wherein the tip 68 travels axially without rotation eliminates alignment problems since the axial motion is along a straight line.

The cover 18 provides certain important safety functions. It protects factory technicians from the high temperature and voltage used when conducting tests. A safety interlock can be provided that prevents operation of the heater means 20 or the test circuit unless the cover 18 is in place. Additionally, the cover 18 protects the wafers being tested from temperature variations or cooling breezes in the factory environment. In this sense the use of the cover 18 provides the advantages of an oven without its disadvantages, primarily, the large expense and size of such apparatus. By appropriately sealing the cover 18 to the base member 22, inert gas can be introduced into the test chamber so that tests can be carried out without the presence of an oxidizing or contaminating atmosphere.

While in the foregoing, a preferred embodiment of the invention has been disclosed, it should be obvious to those skilled in the art that various changes and modifications can be made without departing from the true spirit and scope of the invention as recited in the appended claims.

We claim:

1. Apparatus for testing one of a plurality of semiconductor devices formed on a wafer, said apparatus comprising:

a base having a surface on which semiconductor wafers can be located, said base including heater means for heating said surface and any wafers located thereon;

support stand means associated with said base, said support stand means including a support plate spaced from said surface, a test probe adjustably mounted on said support plate, said test probe extending toward said surface in a direction generally normal thereto and being movable towards and away from said surface whereby the test probe can contact wafers on said surface and nonresiliently clamp them in place.

2. Apparatus in accordance with claim 1 wherein said test probe and said surface are connected in a test circuit.

3. Apparatus in accordance with claims 1 or 2 wherein said test probe includes a tip adapted to engage said wafer and wherein said tip does not rotate when the position of said test probe is adjusted.

4. Apparatus in accordance with claims 1 or 2 wherein said test probe includes an internally threaded sleeve secured to said support plate, an externally threaded spindle engaged in said sleeve whereby rotation of said spindle causes axial movement thereof toward or away from said surface, a holder in bearing engagement with said spindle and a tip carried by said holder for engaging a wafer on said surface.

5. Apparatus in accordance with claim 4 further including spring means biasing said holder into bearing engagement with said spindle.

6. Apparatus in accordance with claims 1 or 2 wherein said test probe includes an internally threaded sleeve secured to said support plate with a portion of said sleeve extending toward said surface, an externally threaded spindle engaged in said sleeve with a portion of said spindle extending toward said surface, said portion of said spindle terminating in an end surface adjacent said surface, a holder having a bearing surface at one end and a needle-like tip extending from its other end toward said surface, spring means biasing said bearing surface into engagement with said end surface of said spindle, rotation of said spindle in one direction causing it to move axially toward said surface with said end surface rotating on said bearing surface and moving said holder toward said surface, rotation of said spindle in the other direction causing it to move axially away from said surface and said spring means causing said holder to move axially away from said surface.

7. Apparatus in accordance with claims 1 or 2 further including a cover of a size to mate with the outer periphery of said surface and enclose said support stand and said probe.

* * * * *